(12) United States Patent
Lee et al.

(10) Patent No.: US 6,750,073 B2
(45) Date of Patent: Jun. 15, 2004

(54) METHOD FOR FORMING A MASK PATTERN

(75) Inventors: Hong Hie Lee, Seoul (KR); Youn Sang Kim, Seoul (KR); Tae Wan Kim, Seoul (KR); Pil Jin Yoo, Seoul (KR)

(73) Assignee: Minuta Technology Co., Ltd. (KR)

( * ) Notice: Subject to any disclaimer, the term of this patent is extended or adjusted under 35 U.S.C. 154(b) by 92 days.

(21) Appl. No.: 10/261,708

(22) Filed: Sep. 30, 2002

(65) Prior Publication Data
US 2004/0063334 A1 Apr. 1, 2004

(51) Int. Cl.⁷ .............................. H01L 21/00; H01L 33/00
(52) U.S. Cl. .............................. 438/29; 438/27; 438/30; 438/65; 438/69
(58) Field of Search ................. 438/27, 29, 30, 438/65, 69; 257/91, 98, 88

(56) References Cited

U.S. PATENT DOCUMENTS

| | | | | |
|---|---|---|---|---|
| 4,643,798 A | * | 2/1987 | Takada et al. ................. | 216/20 |
| 5,122,313 A | * | 6/1992 | Yashima ..................... | 264/1.33 |
| 5,344,748 A | * | 9/1994 | Feely .......................... | 430/330 |
| 5,348,616 A | * | 9/1994 | Hartman et al. ............... | 216/48 |
| 5,489,082 A | * | 2/1996 | Imataki et al. ................ | 249/61 |
| 6,177,236 B1 | * | 1/2001 | Apte .......................... | 430/320 |
| 6,458,263 B1 | * | 10/2002 | Morales et al. ............. | 205/118 |
| 6,472,459 B2 | * | 10/2002 | Morales et al. ............. | 524/439 |
| 6,582,890 B2 | * | 6/2003 | Dentinger et al. .......... | 430/322 |
| 6,623,999 B1 | * | 9/2003 | Nishikawa ................... | 438/29 |

* cited by examiner

*Primary Examiner*—Michael Lebentritt
(74) *Attorney, Agent, or Firm*—Anderson Kill & Olick, PC

(57) ABSTRACT

A mask pattern is formed on a substrate by using a solvent absorbent mold having a pattern structure with a relief and an intaglio portion. A mask layer dissolved in a solvent to obtain fluidity is prepared on the substrate. The mold is pressed onto the mask layer with a predetermined pressure, and a portion of the mask layer that contacts with the relief portion of the mold is introduced into the intaglio portion thereof. Then, the mold absorbs the solvent contained in the mask layer to thereby solidify the mask layer. Next, the mold is separated from the substrate and the portion of the mask layer that contacts with the relief portion of the mold is removed, thus finally obtaining the desired minute mask pattern.

17 Claims, 4 Drawing Sheets

METHOD FOR FORMING A MASK PATTERN

FIELD OF THE INVENTION

The present invention relates to a method for forming a mask pattern on a substrate such as a silicon substrate, a ceramic substrate, a metal layer or a polymer layer; and, more particularly, to a method for forming on a substrate a microscale mask pattern having a size ranging from several nm to several tens μm by way of employing a polymer mold in fabricating an integrated circuit, an electronic device, an optical device, a magnetic device, a surface acoustic wave (SAW) filter and the like.

BACKGROUND OF THE INVENTION

It is well known in the art that a microscale pattern is formed on a substrate in order to fabricate, e.g., semiconductor, electronic, optical, and magnetic devices. Two microscale pattern forming methods have been conventionally employed: one is a micro-contact printing method and the other is an imprinting method.

The micro-contact printing method involves the steps of: wetting a pattern structure, formed on a surface of a polymer mold with a chemical mask material; bringing the pattern structure of the polymer mold into contact with a surface of the substrate to transfer the chemical mask material to the substrate and thus to change the surface condition thereof; and etching the substrate by using the transferred chemical mask material as a resist mask. Though the conventional micro-contact printing method has an advantage that an external force need not to be applied to the substrate, it also has a defect that the chemical mask material may be readily etched during the etching process since the thickness of the chemical mask material is merely several nm. Furthermore, the micro-contact printing method is not adequate for the fabrication of three-dimensional microstructures since the minute adjustment of the thickness of the mask material is very difficult.

Meanwhile, in another conventional micro pattern forming process called the imprinting method, a hard mold with a surface of a desired pattern formed thereon is compressed into a polymer film featuring low fluidity to form a mask pattern on the polymer film. Then, the mask pattern is delivered to an underlying substrate by using, for example, a reactive ion etching technique. Since, however, the imprinting method involves applying a high physical pressure ranging from 3000 to 15000 W/cm² for the imprinting of the mold pattern into the substrate, the substrate and the polymer mask patterns formed thereon may be deformed or even destroyed.

SUMMARY OF THE INVENTION

It is, therefore, an object of the present invention to provide a method for forming a microscale mask pattern on a substrate by using an elastomeric and solvent-absorbent polymer mold.

In accordance with a preferred embodiment of the present invention, there is provided a method for forming a mask pattern on a substrate by using a solvent absorbent mold having a pattern structure with a relief and an intaglio portion, the method including: (a) forming a mask layer on the substrate, the mask layer being dissolved in a solvent to obtain fluidity; (b) placing the mold onto the mask layer with a predetermined pressure so that a portion of the mask layer that contacts with the relief portion of the mold is allowed to be introduced into the intaglio portion thereof and the mold is allowed to absorb the solvent contained in the mask layer to thereby solidify the mask layer; (c) separating the mold from the substrate; and (d) removing the portion of the mask layer that contacts with the relief portion of the mold to thereby obtain the mask pattern.

In accordance with another preferred embodiment of the present invention, there is provided a method for forming a mask pattern on a substrate by using a solvent absorbent mold having a pattern structure with a relief and an intaglio portion, wherein the relief portion has a surface roughness larger than a predetermined level, the method including: (a) forming a mask layer on the substrate, the mask layer being dissolved in a solvent to obtain fluidity; (b) placing the mold onto the mask layer with a predetermined pressure so that a portion of the mask layer that contacts with the relief portion of the mold is allowed to be introduced into the intaglio portion thereof and the mold is allowed to absorb the solvent contained in the mask layer to thereby solidify the mask layer; (c) separating the mold from the substrate so that the portion of the mask layer that contacts with the relief portion of the mold is allowed to have a porous structure having a comparatively low density; and (d) rendering the porous structure lifted-off to thereby obtain the mask pattern.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The technical essence of a mask pattern forming process in accordance with a first embodiment of the present invention lies in that an elastomeric and solvent-absorbent mold is employed to mold a mask pattern on a substrate.

Referring to FIGS. 1A to 1E, there is described a process for forming a polymer mask pattern on a substrate by using an elastomeric and solvent-absorbent mold in accordance with the first embodiment of the present invention.

Figure 1A:
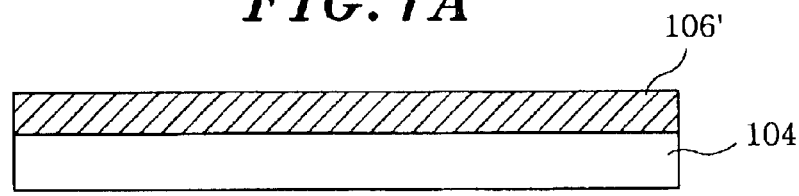
FIGS. 1A to 1E describe a process for forming a polymer mask pattern on a substrate by using an elastomeric and solvent-absorbent mold in accordance with a first preferred embodiment of the present invention.

As shown in FIG. 1A, a polymer film 106', usually made of a polymer material such as 17 wt % of Novolac dissolved in Propylene Glycol Methyl Ether Acetate (PGMEA), is spin-coated onto a substrate 104. The polymer film 106' is made of a polymer material dissolved in a solvent of a low volatility to obtain viscosity and fluidity. The viscosity and fluidity are preferably maintained for a period of time. A Sol-gel type inorganic material can be employed in lie of the polymer material.

Figure 1B:
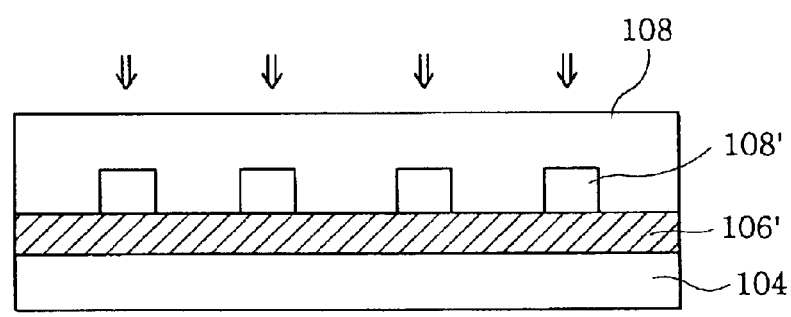

As shown in FIG. 1B, an elastomeric and solvent-absorbent mold 108, e.g., a polydimethylsiloxane (PDMS) mold with a desired pattern formed on its surface is pressed onto the polymer film 106'.

Figure 1C:
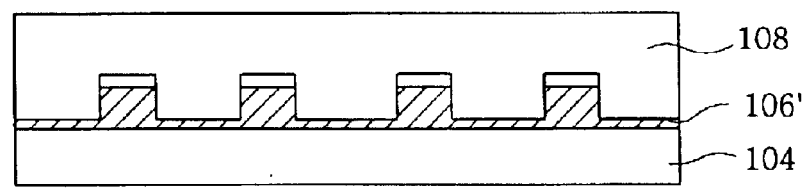

If the mold 108 is placed onto the polymer film 106' with a pressure larger than a predetermined level while the fluidity of the polymer film 106' is maintained, some of the polymer film 106' is brought into pressurized contact with relief portions of the mold 108 and introduced into intaglio portions 108' of the mold 108, as shown in FIG. 1C. If the polymer film 106' and the mold 18 are left undisturbed for a period of time, the solvent in the polymer film 106' diffuses toward the interface between the mold 108 and the polymer film 106', and then is absorbed into the mold 108 which has the solvent-absorptive property. As a result, the polymer film 106' is solidified to have the desired pattern transferred by the mold 108. It is preferable that the rate of solvent absorption by the mold should be larger than the rate of solvent evaporation.

Figure 1D:
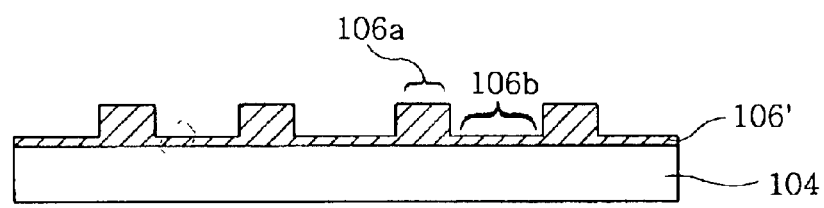

Thereafter, the mold 108 is separated from the polymer film 106', thereby obtaining the patterned polymer film 106' having relief and intaglio portions 106a and 106b as shown in FIG. 1D.

Figure 1E:

Then, an etching process is performed to remove the solidified polymer material on the intaglio portions 106b of the polymer film 106' until the upper surface of the substrate is exposed, so that the desired polymer mask pattern 106' may finally obtained on the substrate 104, as shown in FIG. 1E. To be specific, the etching process is conducted by using, e.g., an etching solution or reactive ion etching (RIE) technique.

The polymer mask pattern is employed to form on the substrate film-patterns such as metal wirings.

Next, a mask pattern forming process in accordance with a second preferred embodiment of the present invention will now be described hereinafter. The second embodiment is different from the first embodiment in that the polymer mold has a surface roughness larger than a predetermined level in addition to a solvent absorbency and an elastic property.

If a relief portion of the mold, which is brought into contact with a polymer film coated on a substrate, has a surface roughness larger than a predetermined level, a contact surface area between the mold and the polymer film is increased, so that a porous structure, i.e., a structure with a number of minute holes formed therein, is formed at regions of the polymer film that contact with the relief portion of the mold. A polymer mask pattern is fabricated by using the porous structure.

First, a polymer film 106' is coated on a substrate 104 by performing the same process as described in FIGS. 1A and 1B. The polymer film 106' is made of a polymer material which is dissolved in a solvent, thus obtaining fluidity.

Figure 2A:
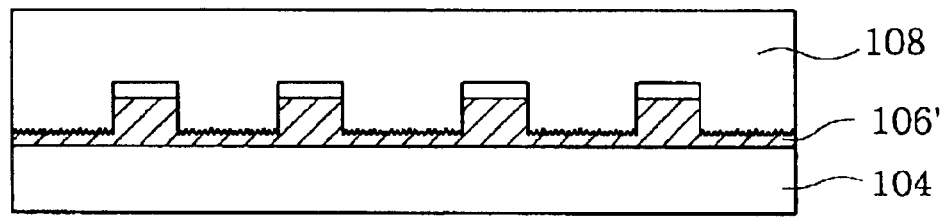
FIGS. 2A to 2C illustrate a process for forming a polymer mask pattern on a substrate by using an elastomeric and solvent absorbent mold having a surface roughness in accordance with a second preferred embodiment of the present invention.

As shown in FIG. 2A, if an elastomeric and solvent-absorbent mold 108, which has a relief portion whose surface roughness is larger than a predetermined value (or falls within a certain range), is placed onto the polymer film 106' with a pressure larger than a predetermined level, some of the polymer film 106' is brought into pressurized contact with the relief portion of the mold 108 and thereby introduced into an intaglio portion 108' of the mold 108. If 17 wt % of Novolac has been spin-coated onto the substrate at 4000 rpm for 7 s, a root mean square (RMS) of the surface roughness of the relief portion on the mold 108 is preferably set to be about 500 to 600 nm.

If the polymer film 106' and the mold 108 are left to be contacted with each other for a period of time, the solvent in the polymer film 106' diffuses toward the interface between the mold 108 and the polymer film 106' and then is absorbed into the mold 108 which has the absorptive property, whereby the polymer film 106' is solidified with a desired pattern formed on its surface.

Figure 2B:
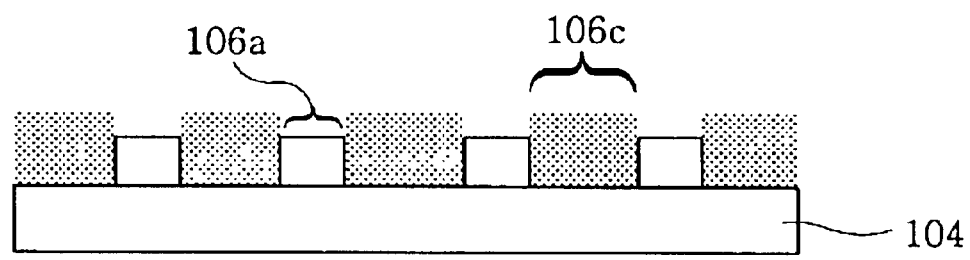
Figure 2C:
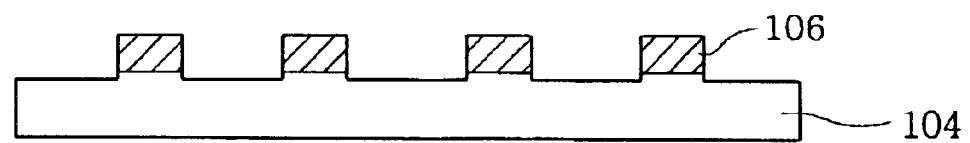

Thereafter, the mold 108 is removed from the polymer film 106'. At this time, the polymer film 106' undergoes a selective change in density as shown in FIG. 2B. To be more specific, the surface roughness of the relief portion of the mold 108 allows the contact surface area to be increased when the relief portion of the mold 108 are brought into contact with the polymer film 106' and the increased contact surface area in turn enhances the adhesive strength therebetween. Thus, if the mold 108 is lifted away from the polymer film 106', a portion of the polymer film 106' that has been in contact with the relief portion of the mold 108 becomes swollen up, thus forming a porous structure 106c having a low density. Accordingly, a relief portion 106a of high density is structurally different from the porous structure 106c of low density.

Next, the substrate 104 is wetted with an etching solution capable of etching the substrate 104. Then, the etching solution passes through the porous structure 106c of the polymer mold 106' to directly remove the top surface of the substrate 104 right below the porous structure 106c and thus make the porous structure 106c lifted off. As a result, a desired polymer mask pattern 106 is finally obtained on the substrate 104 as illustrated in FIG. 3C. The mask pattern forming process in accordance with the second embodiment as describe above has an advantage in that the polymer mask pattern forming step and the silicon substrate etching step can be performed at the same time.

As described in the second preferred embodiment of the present invention, some of the polymer film 106' having been in contact with the relief portion of the mold 108 is changed to have the porous structure 106c, through which the solvent passes to reach and etch the substrate 104, finally obtaining the desired mask pattern 106 on the substrate 104.

Various types of film-patterns can be fabricated on a substrate by using a polymer mask pattern formed in accordance with the present invention as described above. The film-patterns are formed by performing either a film material depositing process or a film material etching process.

Figure 3A:
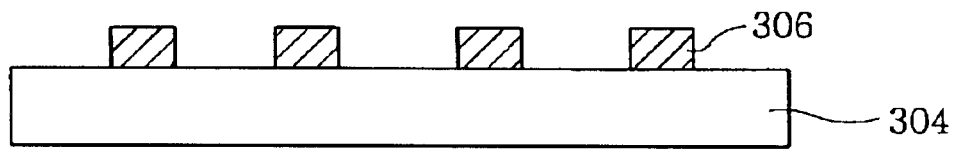
FIGS. 3A to 3C explain a process for fabricating a film-pattern on a substrate by performing a film material depositing process and using a polymer mask pattern formed in accordance with the present invention.
Figure 3B:
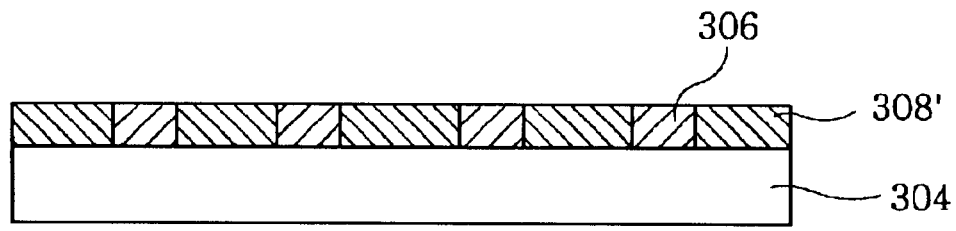
Figure 3C:
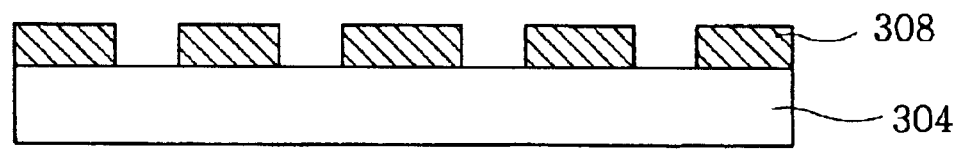

Referring to FIGS. 3A to 3C, there is described a film-pattern forming process employing the film material depositing technique in accordance with a third embodiment of the present invention.

As shown in FIG. 3A, a polymer mask pattern 306 is prepared on a substrate 304 by performing the same process as described in the first and the second preferred embodiments of the present invention. The substrate 304 having the polymer mask pattern formed thereon is put into a deposition reactor containing therein an electroless plating solution in order to form a film layer 308', e.g., an aluminum or a copper layer, to a desired thickness at portions of the substrate 304 where no polymer mask pattern exists.

Thereafter, the polymer mask pattern 306 formed on the substrate 304 is removed by using a solvent such as acetone. Then, the substrate 304 is dried by nitrogen gas blown thereto, thus finishing the film-pattern fabricating process. FIG. 3C illustrates the film-pattern formed on the substrate 304, the film-pattern being made of, e.g., a conductive, an insulating, a semiconductor, or an organic material layer.

Figure 4A:
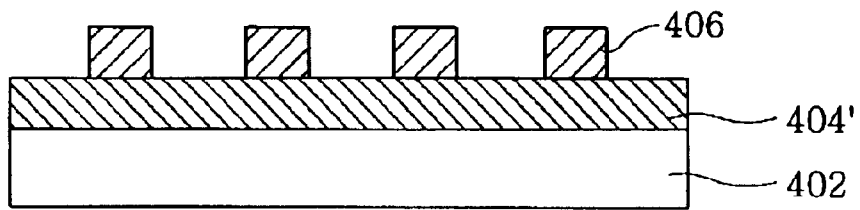
FIGS. 4A to 4C show a process for fabricating a film-pattern on a substrate by performing a film material etching process and using a polymer mask pattern formed in accordance with the present invention.
Figure 4B:
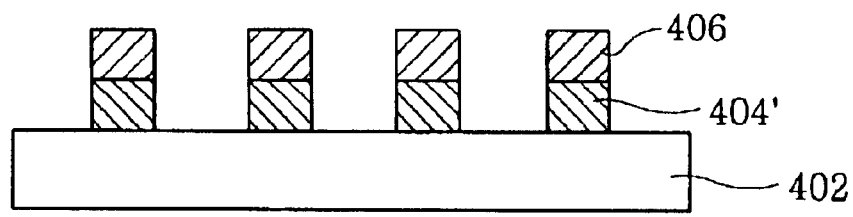
Figure 4C:
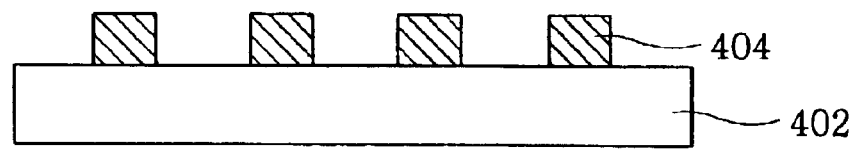

Referring to FIGS. 4A to 4C, there is described a film-pattern fabricating method employing the film material etching process in accordance with a fourth embodiment of the present invention.

As shown in FIG. 4A, a film material layer 404', which is to be patterned to have a desired film-pattern, is plated on a substrate 402 by using, e.g., a spin coating technique before forming polymer mask 406 on the film material layer 404'.

Then, an etching process is performed by using a polymer mask pattern 406 formed on the film material layer 404' as an etching mask, so that the film material layer 404' is selectively removed and the substrate 402 is partially exposed.

Thereafter, the polymer mask pattern 406 is removed by using a solvent such as acetone and the substrate 402 is dried by nitrogen gas blown thereto. As a result, a film-pattern 404 formed of, e.g., a conductive, an insulating, a semiconductor or an organic material layer, is finally obtained on the substrate 402, as illustrated in FIG. 4C.

What is claimed is:

1. A method for forming a mask pattern on a substrate by using a solvent absorbent mold having a pattern structure with a relief and an intaglio portion, the method comprising:
   (a) forming a mask layer on the substrate, the mask layer being dissolved in a solvent to obtain fluidity;
   (b) placing the mold onto the mask layer with a predetermined pressure so that a portion of the mask layer that contacts with the relief portion of the mold is allowed to be introduced into the intaglio portion thereof and the mold is allowed to absorb the solvent contained in the mask layer to thereby solidify the mask layer;
   (c) separating the mold from the substrate; and
   (d) removing the portion of the mask layer that contacts with the relief portion of the mold to thereby obtain the mask pattern.

2. The method of claim 1, further comprising the steps of:
   (e) selectively forming a film material layer made of a film material on the substrate after the step (d); and
   (f) removing the mask pattern to thereby obtain on the substrate a film-pattern made of the film material.

3. The method of claim 1, wherein the step (a) includes the steps of:
   (a1) preparing on the substrate a film material layer made of a film material; and
   (a2) forming on the film material layer the mask layer having fluidity by being dissolved in the solvent, and the method further comprising the steps of:
      (g) selectively removing the film material layer by using the mask pattern as an etching mask to thereby selectively expose a top surface of the substrate; and
      (h) removing the mask pattern to fabricate on the substrate a film-pattern made of the film material.

4. The method of claim 2, wherein the film material layer is made of a layer selected from the group of a conductive, an insulating, a semiconductor and an organic layer.

5. The method of claim 1, wherein the mold is made of a polymer material.

6. The method of claim 1, wherein the mold is made of an inorganic material.

7. The method of claim 1, wherein the mask layer is made of a polymer material.

8. The method of claim 1, wherein the mask layer is made of an inorganic material including a sol-gel type inorganic material.

9. A method for forming a mask pattern on a substrate by using a solvent absorbent mold having a pattern structure with a relief and an intaglio portion, wherein the relief portion has a surface roughness larger than a predetermined level, the method comprising:
   (a) forming a mask layer on the substrate, the mask layer being dissolved in a solvent to obtain fluidity;
   (b) placing the mold onto the mask layer with a predetermined pressure so that a portion of the mask layer that contacts with the relief portion of the mold is allowed to be introduced into the intaglio portion thereof and the mold is allowed to absorb the solvent contained in the mask layer to thereby solidify the mask layer;
   (c) separating the mold from the substrate so that the portion of the mask layer that contacts with the relief portion of the mold is allowed to have a porous structure having a comparatively low density; and
   (d) rendering the porous structure lifted-off to thereby obtain the mask pattern.

10. The method of claim 9, further comprising the steps of:
    (e) selectively forming a film material layer made of a film material on the substrate after the step (d); and
    (f) removing the mask pattern to thereby obtain on the substrate a film-pattern made of the film material.

11. The method of claim 9, wherein the step (a) includes the steps of:
    (a1) preparing on the substrate a film material layer made of a film material; and
    (a2) forming on the film material layer the mask layer having fluidity by being dissolved in the solvent, and the method further comprising the steps of:
       (g) rendering the porous structure lifted-off while concurrently removing a portion of the film material layer on which the porous structure is formed; and
       (h) removing the mask pattern to fabricate on the substrate a film-pattern made of the film material.

12. The method of claim 10, wherein the film material layer is made of a layer selected from the group of a conductive, an insulating, a semiconductor and an organic layer.

13. The method of claim 9, wherein a root mean square (RMS) of the surface roughness of the relief portion on the mold ranges from about 500 to 600 nm.

14. The method of claim 9, wherein the mold is made of a polymer material.

15. The method of claim 9, wherein the mold is made of an inorganic material.

16. The method of claim 9, wherein the mask layer is made of a polymer material.

17. The method of claim 9, wherein the mask layer is made of an inorganic material including a sol-gel type inorganic material.

* * * * *